United States Patent
Hsu

(10) Patent No.: US 8,455,865 B2
(45) Date of Patent: *Jun. 4, 2013

(54) ELECTRICALLY CONDUCTING ORGANIC POLYMER/NANOPARTICLE COMPOSITES AND METHODS FOR USE THEREOF

(75) Inventor: Che-Hsiung Hsu, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/045,207

(22) Filed: Mar. 10, 2011

(65) Prior Publication Data

US 2011/0155966 A1    Jun. 30, 2011

Related U.S. Application Data

(63) Continuation of application No. 10/669,422, filed on Sep. 24, 2003, now abandoned.

(60) Provisional application No. 60/413,114, filed on Sep. 24, 2002.

(51) Int. Cl.
  *H01L 51/00* (2006.01)

(52) U.S. Cl.
  USPC ...... 257/40; 257/103; 257/E31.007; 977/783; 977/952

(58) Field of Classification Search
  USPC .......................................................... 257/40
  See application file for complete search history.

(56) References Cited

U.S. PATENT DOCUMENTS

| | | |
|---|---|---|
| 3,282,875 A | 11/1966 | James |
| 4,358,545 A | 11/1982 | Ezzell et al. |
| 4,433,082 A | 2/1984 | Grot |
| 4,552,927 A | 11/1985 | Warren |
| 4,731,408 A | 3/1988 | Jasne |
| 4,795,543 A | 1/1989 | Stetter et al. |
| 4,869,979 A | 9/1989 | Ohtani et al. |
| 4,940,525 A | 7/1990 | Ezzell |
| 4,959,430 A | 9/1990 | Jonas et al. |
| 5,002,700 A | 3/1991 | Otagawa et al. |
| 5,069,820 A | 12/1991 | Jen et al. |
| 5,160,457 A | 11/1992 | Elsenbaumer |
| 5,185,100 A | 2/1993 | Han et al. |
| 5,247,190 A | 9/1993 | Friend et al. |
| 5,286,413 A | 2/1994 | Hannecart |
| 5,300,575 A | 4/1994 | Jonas |

(Continued)

FOREIGN PATENT DOCUMENTS

| | | |
|---|---|---|
| CN | 1439029 A | 8/2003 |
| CN | 1934725 A | 3/2007 |

(Continued)

OTHER PUBLICATIONS

U.S. Appl. No. 10/804,503 (Now issued Patent No. US 7,317,047).

(Continued)

*Primary Examiner* — Jerome Jackson, Jr.

(57) ABSTRACT

Compositions are provided comprising aqueous dispersions of electrically conducting organic polymers and a plurality of nanoparticles. Films cast from invention compositions are useful as buffer layers in electroluminescent devices, such as organic light emitting diodes (OLEDs) and electrodes for thin film field effect transistors. Buffer layers containing nanoparticles have a much lower conductivity than buffer layers without nanoparticles. In addition, when incorporated into an electroluminescent (EL) device, buffer layers according to the invention contribute to higher stress life of the EL device.

6 Claims, 1 Drawing Sheet

U.S. PATENT DOCUMENTS

| | | | |
|---|---|---|---|
| 5,317,169 | A | 5/1994 | Nakano et al. |
| 5,378,402 | A | 1/1995 | Cross et al. |
| 5,463,005 | A | 10/1995 | Desmarteau |
| 5,537,000 | A | 7/1996 | Alivisatos et al. |
| 5,705,888 | A | 1/1998 | Staring et al. |
| 5,798,170 | A | 8/1998 | Zhang et al. |
| 5,863,465 | A | 1/1999 | Kinlen |
| 5,917,279 | A | 6/1999 | Elschner et al. |
| 5,986,400 | A | 11/1999 | Staring et al. |
| 5,994,496 | A | 11/1999 | Van Haare et al. |
| 6,097,147 | A | 8/2000 | Baldo et al. |
| 6,150,426 | A | 11/2000 | Curtin |
| 6,210,790 | B1 | 4/2001 | Crivello |
| 6,303,238 | B1 | 10/2001 | Thompson et al. |
| 6,303,943 | B1 | 10/2001 | Yu et al. |
| 6,319,428 | B1 | 11/2001 | Michot et al. |
| 6,324,091 | B1 | 11/2001 | Gryko et al. |
| 6,337,370 | B1 | 1/2002 | Bae et al. |
| 6,358,437 | B1 | 3/2002 | Jonas |
| 6,515,314 | B1 | 2/2003 | Duggal et al. |
| 6,593,690 | B1 | 7/2003 | McCormick et al. |
| 6,632,472 | B2 | 10/2003 | Louwet |
| 6,670,645 | B2 | 12/2003 | Grushin et al. |
| 6,706,963 | B2 | 3/2004 | Gaudiana et al. |
| 6,717,358 | B1 | 4/2004 | Liao et al. |
| 6,756,474 | B2 | 6/2004 | Hsu |
| 6,830,828 | B2 | 12/2004 | Thompson et al. |
| 6,875,523 | B2 | 4/2005 | Grushin et al. |
| 6,923,881 | B2 | 8/2005 | Tateishi et al. |
| 6,924,047 | B2 | 8/2005 | Radu et al. |
| 6,955,773 | B2 | 10/2005 | Hsu |
| 6,963,005 | B2 | 11/2005 | Lecloux et al. |
| 7,112,369 | B2 | 9/2006 | Wang et al. |
| 7,166,010 | B2 | 1/2007 | Lamansky et al. |
| 7,189,771 | B2 | 3/2007 | Hsu |
| 7,211,824 | B2 | 5/2007 | Lazarev |
| 7,244,797 | B2 | 7/2007 | Kurihara |
| 7,250,461 | B2 | 7/2007 | Hsu |
| 7,307,276 | B2 | 12/2007 | Andriessen |
| 7,317,047 | B2 | 1/2008 | Hsu |
| 7,338,620 | B2 | 3/2008 | Hsu et al. |
| 7,354,532 | B2 | 4/2008 | Hsu et al. |
| 7,371,336 | B2 | 5/2008 | Hsu et al. |
| 7,390,438 | B2 | 6/2008 | Hsu et al. |
| 7,431,866 | B2 | 10/2008 | Hsu et al. |
| 7,455,793 | B2 | 11/2008 | Hsu et al. |
| 7,462,298 | B2 | 12/2008 | Hsu et al. |
| 7,569,158 | B2 | 8/2009 | Waller et al. |
| 7,593,004 | B2 | 9/2009 | Spath et al. |
| 7,727,421 | B2 | 6/2010 | Hsu et al. |
| 7,749,407 | B2 | 7/2010 | Hsu et al. |
| 7,837,901 | B2 | 11/2010 | Hsu et al. |
| 8,088,499 | B1 | 1/2012 | Wang et al. |
| 2001/0019782 | A1 | 9/2001 | Igarashi et al. |
| 2001/0038937 | A1 | 11/2001 | Suzuki et al. |
| 2002/0009680 | A1 | 1/2002 | Majumdar |
| 2002/0017612 | A1 | 2/2002 | Yu et al. |
| 2002/0038999 | A1 | 4/2002 | Cao |
| 2002/0041151 | A1 | 4/2002 | Park |
| 2002/0098377 | A1 | 7/2002 | Cao et al. |
| 2002/0099119 | A1 | 7/2002 | Craig |
| 2002/0127381 | A1 | 9/2002 | Will et al. |
| 2002/0190250 | A1 | 12/2002 | Grushin et al. |
| 2002/0192476 | A1 | 12/2002 | Kambe et al. |
| 2003/0020073 | A1 | 1/2003 | Long et al. |
| 2003/0108771 | A1 | 6/2003 | Lecloux et al. |
| 2003/0118829 | A1 | 6/2003 | Hsu |
| 2003/0213952 | A1 | 11/2003 | Iechi et al. |
| 2004/0009346 | A1 | 1/2004 | Jang et al. |
| 2004/0036067 | A1 | 2/2004 | Andriessen |
| 2004/0072987 | A1 | 4/2004 | Groenendaal et al. |
| 2004/0092700 | A1 | 5/2004 | Hsu |
| 2004/0102577 | A1 | 5/2004 | Hsu et al. |
| 2004/0124504 | A1 | 7/2004 | Hsu |
| 2004/0127637 | A1 | 7/2004 | Hsu et al. |
| 2004/0149952 | A1 | 8/2004 | DePenning et al. |
| 2004/0149962 | A1 | 8/2004 | Andriessen |
| 2004/0206942 | A1 | 10/2004 | Hsu |
| 2004/0217877 | A1 | 11/2004 | Kokonaski et al. |
| 2004/0222413 | A1 | 11/2004 | Hsu et al. |
| 2004/0254297 | A1 | 12/2004 | Hsu et al. |
| 2004/0262599 | A1 | 12/2004 | Bernds |
| 2005/0069726 | A1 | 3/2005 | Douglas et al. |
| 2005/0070654 | A1 | 3/2005 | Hsu |
| 2005/0089679 | A1 | 4/2005 | Ittel et al. |
| 2005/0124784 | A1 | 6/2005 | Sotzing |
| 2005/0184287 | A1 | 8/2005 | Herron et al. |
| 2005/0205860 | A1 | 9/2005 | Hsu et al. |
| 2005/0208328 | A1 | 9/2005 | Hsu et al. |
| 2005/0209388 | A1 | 9/2005 | Hsu et al. |
| 2005/0209392 | A1 | 9/2005 | Luo et al. |
| 2005/0222333 | A1 | 10/2005 | Hsu |
| 2005/0224765 | A1 | 10/2005 | Hsu et al. |
| 2005/0224788 | A1 | 10/2005 | Hsu et al. |
| 2006/0051401 | A1 | 3/2006 | Manohar |
| 2006/0076050 | A1 | 4/2006 | Williams et al. |
| 2006/0076557 | A1 | 4/2006 | Waller et al. |
| 2006/0076577 | A1 | 4/2006 | Boos et al. |
| 2006/0113510 | A1 | 6/2006 | Luo et al. |
| 2006/0180810 | A1 | 8/2006 | Lee et al. |
| 2006/0274049 | A1 | 12/2006 | Spath et al. |
| 2006/0289843 | A1 | 12/2006 | Hsu et al. |
| 2006/0292362 | A1 | 12/2006 | Hsu et al. |
| 2007/0045591 | A1 | 3/2007 | Hsu et al. |
| 2007/0069184 | A1 | 3/2007 | Hsu et al. |
| 2007/0069185 | A1 | 3/2007 | Hsu et al. |
| 2007/0096082 | A1 | 5/2007 | Gaynor et al. |
| 2008/0128662 | A1 | 6/2008 | Hsu et al. |
| 2008/0135809 | A1 | 6/2008 | Hsu |
| 2008/0213594 | A1 | 9/2008 | Hsu |
| 2008/0248314 | A1 | 10/2008 | Hsu et al. |
| 2008/0251768 | A1 | 10/2008 | Hsu et al. |
| 2008/0258605 | A1 | 10/2008 | Yukinobu |
| 2008/0283800 | A1 | 11/2008 | Hsu |
| 2008/0296536 | A1 | 12/2008 | Hsu et al. |
| 2009/0008609 | A1 | 1/2009 | Yeisley et al. |
| 2009/0072201 | A1 | 3/2009 | Hsu et al. |
| 2009/0114884 | A1 | 5/2009 | Hsu |
| 2009/0154059 | A1 | 6/2009 | Wessling et al. |

FOREIGN PATENT DOCUMENTS

| | | |
|---|---|---|
| DE | 4334390 A1 | 4/1995 |
| EP | 560721 A2 | 9/1993 |
| EP | 440957 A2 | 3/1996 |
| EP | 488321 A1 | 10/1997 |
| EP | 817540 A2 | 1/1998 |
| EP | 593111 A1 | 6/1998 |
| EP | 1231251 A1 | 8/2002 |
| EP | 1286569 A1 | 2/2003 |
| EP | 962943 A1 | 12/2003 |
| EP | 1371709 A1 | 12/2003 |
| EP | 1408563 A2 | 4/2004 |
| EP | 1026152 B1 | 7/2006 |
| EP | 1726051 A1 | 11/2006 |
| EP | 1191614 B1 | 5/2009 |
| EP | 1191612 B1 | 9/2009 |
| FR | 2632979 A1 | 12/1989 |
| GB | 2124635 A | 2/1984 |
| JP | 62119237 A | 5/1987 |
| JP | 01038808 A | 2/1989 |
| JP | 01038808 B | 8/1989 |
| JP | 02249221 A | 10/1990 |
| JP | 04234453 A | 8/1992 |
| JP | 05129162 A | 5/1993 |
| JP | 09176310 A | 7/1997 |
| JP | 11186103 A | 7/1999 |
| JP | 11353934 A | 12/1999 |
| JP | 2000505249 A | 4/2000 |
| JP | 2001006878 A | 1/2001 |
| JP | 2001270999 A | 10/2001 |
| JP | 2001325831 A | 11/2001 |
| JP | 2002500408 A | 1/2002 |
| JP | 2002082082 A | 3/2002 |
| JP | 2002246177 A | 8/2002 |
| JP | 2002293888 A | 10/2002 |
| JP | 2003187983 A | 7/2003 |
| JP | 2003217862 A | 7/2003 |

| | | | |
|---|---|---|---|
| JP | 2003264083 A | 9/2003 | |
| JP | 2003297582 A | 10/2003 | |
| JP | 2004500449 T | 1/2004 | |
| JP | 2004501494 T | 1/2004 | |
| JP | 2004502004 T | 1/2004 | |
| JP | 2004082395 A | 3/2004 | |
| JP | 2005139376 A | 6/2005 | |
| JP | 2005537348 A | 12/2005 | |
| JP | 2006108064 A | 4/2006 | |
| JP | 2006527277 A | 11/2006 | |
| JP | 2007502531 A | 2/2007 | |
| JP | 2007529607 A | 10/2007 | |
| JP | 2007531802 A | 11/2007 | |
| JP | 2008547185 A | 12/2008 | |
| JP | 2009502025 A | 1/2009 | |
| JP | 2010534739 A | 11/2010 | |
| TW | 200304238 | 9/2003 | |
| WO | 9831716 A1 | 7/1998 | |
| WO | 9934371 A1 | 7/1999 | |
| WO | 9952954 A1 | 10/1999 | |
| WO | 0070655 A2 | 11/2000 | |
| WO | 0138219 A1 | 5/2001 | |
| WO | 0141230 A1 | 6/2001 | |
| WO | 0141512 A1 | 6/2001 | |
| WO | 0199192 A2 | 12/2001 | |
| WO | 0199207 A2 | 12/2001 | |
| WO | 0200759 A1 | 1/2002 | |
| WO | 0202714 A2 | 1/2002 | |
| WO | 0215645 A1 | 2/2002 | |
| WO | 02065484 A1 | 8/2002 | |
| WO | 02099907 A1 | 12/2002 | |
| WO | 03006515 A1 | 1/2003 | |
| WO | 03006537 A1 | 1/2003 | |
| WO | 03008424 A1 | 1/2003 | |
| WO | 03012908 A2 | 2/2003 | |
| WO | 03040257 A1 | 5/2003 | |
| WO | 03046540 A1 | 6/2003 | |
| WO | 03050824 A1 | 6/2003 | |
| WO | 03063555 A1 | 7/2003 | |
| WO | 03074601 A2 | 9/2003 | |
| WO | 03091688 A2 | 11/2003 | |
| WO | 2004016710 A1 | 2/2004 | |
| WO | 2004020444 A1 | 3/2004 | |
| WO | 2004020502 A1 | 3/2004 | |
| WO | 2004029128 A2 | 4/2004 | |
| WO | 2004029133 A1 | 4/2004 | |
| WO | 2004029176 A1 | 4/2004 | |
| WO | 2004094501 A2 | 11/2004 | |
| WO | 2004105150 A1 | 12/2004 | |
| WO | 2005003083 A1 | 1/2005 | |
| WO | 2005018012 A1 | 2/2005 | |
| WO | 2005024853 A1 | 3/2005 | |
| WO | 2005041217 A1 | 5/2005 | |
| WO | 2005052027 A1 | 6/2005 | |
| WO | 2005080525 A2 | 9/2005 | |
| WO | 2005090435 A1 | 9/2005 | |
| WO | 2005090436 A1 | 9/2005 | |
| WO | 2005093872 A1 | 10/2005 | |
| WO | 2005121217 A1 | 12/2005 | |
| WO | 2006073968 A2 | 7/2006 | |
| WO | 2006078264 A2 | 7/2006 | |
| WO | 2007002681 A2 | 1/2007 | |
| WO | 2007002737 A2 | 1/2007 | |
| WO | 2007002740 A2 | 1/2007 | |
| WO | 2007092296 A2 | 8/2007 | |
| WO | 2007120143 A1 | 10/2007 | |
| WO | 2009018009 A1 | 2/2009 | |

OTHER PUBLICATIONS

U.S. Appl. No. 10/803,114 (Now issued Patent No. US7,250,461).
Appleby et al.,—Polymeric Perfluoro Bis-Sulfonimides as Possible Fuel Cells Electrolytes, J. Electrochem. Soc., 1993 vol. 140 pp. 109-111.
Arnautov et al., New Dopant-Solvent System for Conductive PAN Films Production, Synthetic Metals, 1997, vol. 84, No. 1-3, pp. 133-134, Elsevier Science S.A.
Baytron Coating Guide Issue Oct. 2002—Obtained From www.hcstarck-echemicals.com.
Baytron H. C. Stark GMBH (Brochure) No Date.
Baytron P VAP A1 4083 and Baytron P VP CH 8000 Product Information for Electronic Grades Designed for Use as Hole-Injection Material in OLEDS—Obtained From www.hcstarck-echemicals.com.
Baytron Product info from baytron.com; 20070801.
Brown et al, "Built-in field electroabsorbtion spectroscopy of plymer light-emitting diodes incorporating a doped poly (3,4-ethylene dioxythiophene) hole injection layer," Applied Physics Letters, AIP, American Institute of Physics, vol. 75, No. 12, Sep. 20, 1999, pp. 1679-1681.
Cen et al., 1,1,2,2-Tetrafluoro-2-(polyfluoroalkoxy)ethanesulfonic Acids, 1,1,2,2-Tetrafluoro-2-(perfluoroalkoxy) ethanesulfonic Acids, and 2,2'-Oxybis(1,1,2,2-tetrafluoroethanesulfonic acid), Inorganic Chemistry, 1988, vol. 27, pp. 1376-1377, American Chemical Society.
Colvin et al—Light-Emitting Diodes Made From Cadmium Selenide Nanocrystals and a Semiconducting Polymer, Nature, 1994, vol. 370 pp. 354-357.
Conductive Polymer From Wikipedia, The Free Encyclopedia.
Database CA [Online] Chemical Abstracts Service, Columbus, OH, US; Jan. 9, 1988, Iwata, Kaoru et al: "Dopants for electrically conductive polymers" XP002335513 retrieved from STN Database accession No. 1988:7040 abstract.
Database CA [Online] Chemical Abstracts Service, Columbus, Ohio, US; Takei, Masashi et al: Metal colloid solution, electric conductor ink, electric conductor coating, and undercoating film for forming electric conductor coating layer, retrieved from STN Database accession No. 2001:847689.
Database CA [Online] Chemical Abstracts Service, Columbus, Ohio, US; Wakita, Katsuya et al: "High performance odor sensors and mthod for their manufacture," retrieved from STN Database accession No. 2002:219874.
Database CA [Online] Chemical Abstracts Service, Morimoto, Takeshi et al: "Solid Electrolytic Capacitor having Electrically Conductive Plymer on Dielectric Oxide Film" Database Accession No. 1991:113460, American Chemical Society, Columbus, OH, Oct. 5, 1990.
Desmarteau, Novel Perfluorinated Ionomers and Ionenes, J. Fluorine Chem., 1995 vol. 72 pp. 203-208.
Downs C et al: "Efficient Polymerization of Aniline at Carbon Nanotube Electrodes", Advanced Materials, vol. 11, No. 12, Jan. 1, 1999, pp. 1028-1031.
Feiring et al.—Aromatic Monomers With Pendant Fluoroalkysolfonate and Sulfonimide Groups, J Fluorine Chemistry, 2000 vol. 105 pp. 129-135.
Feiring et al.—Novel Aromatic Polymers With Pendant Lithium Perfluoroalkylsulfonate or Sulfonimide Groups, Macromolecules 2000 vol. 33 pp. 9262-9271.
Fowler J D et al: "Hydrogen detection by Polyaniline nanofibers on gold and platinum electrodes", The Journal of Physical Chemistry C, vol. 113, No. 16, Sep. 4, 2001, pp. 6444-6449.
Gustafsson et al.—Flexible Light-Emitting Diodes Made From Soluble Conducting Polymers, Nature 1992 vol. 357 pp. 477-479.
Hirai et al; "Electrochemical Behaviors of Polypyrrole, Poly-3-Methyl-thiophene, and Polyaniline Deposited on Nafion-Coated Electrodes," Journal of the Electrochemical Society, vol. 135, No. 5, May 1, 1988, pp. 1132-1137, Electrochemical Society, Manchester, NH.
Hsu, C.-H., Novel Preparation and Properties of Conductive Polyaniline/Nafion® Film, Synthetic Metals, 1991, 671-674,41-43, Elsevier Sequoia, The Netherlands.
Iijima et al.—Single-Shell Carbon Nanotubes of 1-nm Diameter, Nature, 1993 vol. 363 pp. 603-605.
Ivanov et al, The Study of Carbon Nanotubules Produced by Catalytic Method, Chem. Phys. Lett. 1994, vol. 223 pp. 329-335.
Journet et al.,—Large-Scale Production of Single-Walled Carbon Nanotubes by the Electric-Arc Technique, Nature, 1997 vol. 388 pp. 756-758.
Kim et al, Enhancement of Electrical Conductivity of Poly(3,4-ethylenedioxythiophene)/Poly(4-styrenesulfonate) by a Change of Solvents, Synthetic Metals, Elsevier Sequoia, vol. 126, No. 2/3, pp. 311-316, Feb. 2002.

Kitani et al; "Properties of Elastic Polyaniline," Synthetic Metals, vol. 84, No. 1-3, 1997, pp. 83-84, Elsevier Science S. A.

Lee et al, POLY(thieno(3,4-b)thiophene) a New Stable Low Band Gap Conducting Polymer, Macromolecules 2001 vol. 34 pp. 5746-5747.

Levi et al—Polymer and Cathode Emission Studies of Polymer-Based Light-Emitting Diodes Under Strong Electrial Pulse Excitation, Journal of Applied Physics, 2000 vol. 88 No. 5 pp. 2548-2552.

Li et al—Large-Scale Synthesis of Aligned Carbon Nanotubes, Science, 1996 vol. 274 pp. 1701-1703.

Lim et al—Degradation of Organic Light-Emitting Devices Due to Formation and Growth of Dark Spots, Materials Science and Engineering 2001, pp. 154-159.

Madler et al—Visibly Transparent and Radiopaque Inorganic Organic Composites From Flange-Made Mixed-Oxide Fillers. Journal of Nanoparticle Research, vol. 8, No. 3-4, 2005, pp. 323-333.

Riedel et al., Tailored Highly Transparent Composite Hole-Injection Layer Consisting of PETOT: PSS and SiO2 Nanoparticles for Efficient Polymer Light-Emitting Diodes, Advanced Materials, 2011 vol. 23 pp. 740-745.

Römpp Chemistry Dictionary, 9th Edition, 1993 (Machine translation also submitted).

Schroedner et al—Organische Feldeffekttransistoren Auf Basis Halbleitender Polymere/ Organic Field-Effect Transistors Based on Semiconducting Polymers. Elektrotechnik Und Informationstechnik, Springer Verlag. 2003 vol. 120 No. 6, pp. 205-209 (Machine translation also submitted).

Sharpe et al—Improved Cationic Conductive Polymer, Calgon Corp, Coating Conference (Proceeding) 1981 pp. 83-87.

Simpson et al.—Advances and Applications of Inherently Conductive Polymer Technologies Based on Poly(3,4-Ethylenedioxythiophene) 2005 AIMCAL Fall Technical Conference.

Sotzing et al—Poly(thieno(3,4-b)thiophene): A p- andn-Dopable Polythiophene Exhibiting High Optical Transparency in the Semiconducting State, Macromolecules, 2002 vol. 35 pp. 7281-7286.

Thelakkat et al—Poly(Triarylamine)S-Synthesis and Application in Electroluminescent Devices and Photovoltaics, Synthetic Metals, 1999, vol. 102 pp. 1125-1128.

Thess et al., Crystalline Ropes of Metallic Carbon Nanotubes, Science, 1996 vol. 273 pp. 483-487.

Wang—Photoconductive Materials, Kirk-Othmer Encyclopedia of Chemical Technology, Fourth Edition, 1996, vol. 18 pp. 837-860.

Wu et al, Transparent, Conductive Carbon Nanotube Files, Science, 2004, vol. 305, pp. 1273-1276.

Yang S-M et al: "The photoelectrochemical properties of TiO2 electrodes modified by quantum sized PbS and thiols", Synthetic Metals, vol. 123, No. 2, Sep. 4, 2001, pp. 267-272.

Yuan Y F et al: "Size and morphology effects of ZnO anode nanomaterials for Zn/Ni secondary batteries; Size and morphology effects of ZnO anode nanomaterials for Zn/Ni secondary batteries", Nanotechnology, vol. 16, No. 6, Jun. 1, 2005, pp. 803-808.

Aleshin et al., "Transport Properties of Poly(3,4-ethylenedioxythiophene)/poly(styrenesulfonate)," Synthetic Metals, 1998, vol. 94, pp. 173-177.

Bharathan et al., "Polymer/metal Interfaces and the Performance of Polymer Light-Emitting Diodes," Journal of Applied Physics, 1998, vol. 84(6), pp. 3207-3211.

Huang et al., "Well-Dispersed Single-Walled Carbon Nanotube/ Polyaniline Composite Films," Carbon, vol. 41, 2003, pp. 2731-2736.

Schwendeman et al; Perfluoroalkanoate-substituted PEDOT for Electronic Device Applications, Advanced Functional Materials, vol. 13, No. 7, 2003, pp. 541-547.

Stejskal et al., "Polyaniline Dispersions 10. Coloured Microparticles of Variable Density Prepared Using Stabilizer Mixtures," Colloid Polymer Science, vol. 278, 2000, pp. 654-658.

Tang et al., "Organic/Inorganic Material for Coating on Metals," Materials Research Society Symp. Proc., vol. 734, 2003, pp. B.9.57.1-7.

U.S. Appl. No. 10/803,114 (published as US Application No. 2005/ 0209388, Sep. 22, 2005).

U.S. Appl. No. 10/804,503 (Issued as US Patent 7,317,047, Jan. 8, 2008. This is the US counterpart to the opposed patent).

Opposition Against EP 1726051, Opposition Document from Herzog Fiesser & Partner; Heraeus Precious Metals GmbH; Sep. 15, 2011 [German].

Opposition Against EP 1726051, Opposition Document from Herzog Fiesser & Partner; Heraeus Precious Metals GmbH; Sep. 15, 2011 [English Translation].

Opposition Against EP 1726051; Observations of the Patentee; May 31, 2011.

Opposition Against EP 1726051; Main Request—Claims; May 31, 2012.

Opposition Against EP 1726051; First Auxiliary Request—Claims; May 31, 2012.

Opposition Against EP 1726051; Second Auxiliary Request—Claims; May 31, 2012.

Opposition Against EP 1726051; Third Auxiliary Request—Claims; May 31, 2012.

Opposition Against EP 1726051; Fourth Auxiliary Request—Claims; May 31, 2012.

Opposition Against EP 1726051; Fifth Auxiliary Request—Claims; May 31, 2012.

Opposition Against EP 1726051; Sixth Auxiliary Request—Claims; May 31, 2012.

Opposition Against EP 1726051; Seventh Auxiliary Request—Claims; May 31, 2012.

Opposition Against EP 1726051; Eighth Auxiliary Request—Claims; May 31, 2012.

Opposition Against EP 1726051; Ninth Auxiliary Request—Claims; May 31, 2012.

Opposition Against EP 1726051; Tenth Auxiliary Request—Claims; May 31, 2012.

Opposition Against EP 1726051; Eleventh Auxiliary Request—Claims; May 31, 2012.

Opposition Against EP 1726051; Experimental Data; PEDOT (E6); May 31, 2012.

Opposition Against EP 1726051; Experimental Data; Polypyrrole/ Nafion (E9); Jul. 2, 2012.

EESR 20101201; Extended European Search Report, EP 10005557.3, Dec. 1, 2010.

EESR 20110517; Extended European Search Report for Application No. EP 10 01 1570; May 17, 2011.

EESR 20110621; Extended European Search Report for Application No. EP 06 774 171; Jun. 21, 2011.

ISR 20040217; PCT International Search Report for PCT/US2003/ 030509; C. Meiners Authorized Officer; Feb. 17, 2004.

ISR 20050630; PCT International Search Report for PCT/US2005/ 008561; G. Wolfbauer Authorized Officer; Jun. 30, 2005.

ISR 20050802; PCT International Search Report for International Application No. PCT/US2005/012460; C. Meiners Authorized Officer; Apr. 12, 2005.

ISR 20080206; PCT International Search Report for International Application No. PCT/US06/25129; Elizabeth Robinson Authorized Officer Feb. 6, 2008.

ISR 20081031PCT International Search Report for International Application No. PCT/US08/070718; Benedikt Schlicke Authorized Officer Oct. 31, 2008.

ISR 20090107; PCT International Search Report for International Application No. PCT/US2009/037461; Christian Meiners Authorized Officer Jan. 7, 2009.

ISR 20090409; PCT International Search Report for International Application No. PCT/US09/35079; Lee W. Young Authorized Officer Apr. 9, 2009.

ISR 20101217; PCT International Search Report for International Application No. PCT/US2010/031836; Rahn Kim Authorized Officer Dec. 17, 2010.

ISR 20101220; PCT International Search Report for International Application No. PCT/US2010/032175; Kim Rahn Authorized Officer Dec. 20, 2010.

Opposition Against EP 1726051, Opposition Document from Herzog Fiesser & Partner; Heraeus Precious Metals GmbH; Sep. 15, 2011 [German Original] (English translation also provided).

Extended European Search Report for Application No. 10005557.3; 20100628, Jun. 28, 2010.

ELECTRICALLY CONDUCTING ORGANIC POLYMER/NANOPARTICLE COMPOSITES AND METHODS FOR USE THEREOF

RELATED APPLICATION

This application is a continuation of U.S. application Ser. No. 10/669,422, filed Sep. 24, 2003, and claims priority from U.S. Provisional Application No. 60/413,114, filed Sep. 24, 2002.

FIELD OF THE INVENTION

The invention relates to the use of conductive organic polymers in the production of pixelated electroluminescent devices, such as organic light emitting diodes, and thin film field effect transistor electrodes.

BACKGROUND

Conductive organic polymers originally attracted the attention of researchers over 20 years ago. The interest generated by these polymers compared to conventional conducting materials (e.g., metals, semiconductive metal oxides) was largely due to factors such as light weight, flexibility, durability, and potential ease of processing. To date the most commercially successful conductive organic polymers are the polyanilines and polythiophenes, which are marketed under a variety of tradenames. These materials can be prepared by polymerizing aniline or dioxythiophene monomers in aqueous solution in the presence of a water soluble polymeric acid, such as poly(styrenesulfonic acid) (PSS), as described in, for example, U.S. Pat. No. 5,300,575 entitled "Polythiophene dispersions, their production and their use." The recent development of electroluminescent (EL) devices for use in light emissive displays and thin film field effect transistors for use as electrodes has resulted in a new area of interest in conductive organic polymers. EL devices such as organic light emitting diodes (OLEDs) containing conductive organic polymers generally have the following configuration:

anode/buffer layer/EL polymer/cathode

The anode is typically any material that has the ability to inject holes into the otherwise filled π-band of the semiconducting, EL polymer, such as, for example, indium/tin oxide (ITO). The anode is optionally supported on a glass or plastic substrate. The EL polymer is typically a conjugated semiconducting organic polymer such as poly(paraphenylenevinylene) or polyfluorene. The cathode is typically any material, such as Ca or Ba, that has the ability to inject electrons into the otherwise empty π*-band of the semiconducting, EL polymer.

The buffer layer is typically a conductive organic polymer which facilitates the injection of holes from the anode into the EL polymer layer. The buffer layer can also be called a hole-injection layer, a hole transport layer, or may be characterized as part of a bilayer anode. Typical aqueous-dispersible conductive organic polymers employed as buffer layers are the emeraldine salt form of polyaniline (PAni) or a polymeric dioxyalkylenethiophene doped with a polymeric sulfonic acid.

While the buffer layer must have some electrical conductivity in order to facilitate charge transfer, the highest conductivity of buffer layer films derived from commonly known aqueous polyaniline or polythiophene dispersion is generally in the range of about $10^{-3}$ S/cm. The conductivity is about three order magnitude higher than necessary. Indeed, in order to prevent cross-talk between anode lines (or pixels), the electrical conductivity of the buffer layers should be minimized to about $10^{-6}$ S/cm without negatively affecting the light emitting properties of a device containing such a buffer layer For example, a film made from a commercially available aqueous poly(ethylenedioxythiophene) dispersion, Baytron-P VP AI 4083 from H. C. Starck, GmbH, Leverkusen, Germany, has conductivity of $\sim 10^{-3}$ S/cm. This is too high to avoid cross-talk between pixels. Accordingly, there is a need for high resistance buffer layers for use in electroluminescent devices.

SUMMARY OF THE INVENTION

Compositions are provided comprising aqueous dispersions of electrically conducting organic polymers and a plurality of nanoparticles. Invention compositions are capable of providing continuous, smooth thin films as buffer layers in electroluminescent devices, such as organic light emitting diodes (OLEDs) or as electrodes for thin film field effect transistors. Nanoparticles contemplated for use in the practice of the invention can be inorganic or organic. Buffer layers containing inorganic or organic nanoparticles have a much lower conductivity than buffer layers without such nanoparticles. When incorporated into an electroluminescent (EL) device, buffer layers according to the invention provide high resistance while contributing to higher stress life of the EL device.

In accordance with another embodiment of the invention, there are provided electroluminescent devices comprising buffer layers cast from invention aqueous dispersions.

In accordance with a further embodiment of the invention, there are provided methods for reducing the conductivity of an electrically conductive organic polymer film cast from an aqueous dispersion of an electrically conducting polymer onto a substrate, comprising adding a plurality of nanoparticles to the aqueous dispersion.

In a still further embodiment of the invention, there are provided methods for producing buffer layers having increased thickness, the method comprising adding a plurality of nanoparticles to an aqueous dispersion of a conductive organic polymer, and casting a buffer layer from said aqueous dispersion onto a substrate.

In yet another embodiment of the invention, there are provided thin film field effect transistor electrodes cast from invention aqueous dispersions.

In a still further embodiment of the invention, there provided methods for increasing conductivity of thin film field effect transistor electrodes cast from aqueous dispersion onto a substrate.

DETAILED DESCRIPTION

Figure 1:
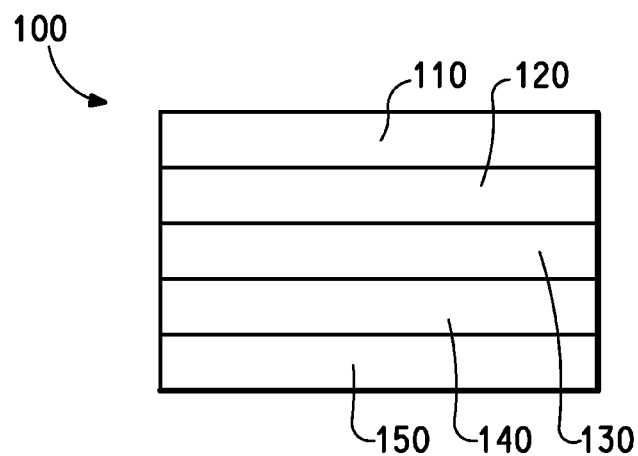
FIG. 1 illustrates a cross-sectional view of an electronic device that includes a buffer layer according to the invention.

Compositions are provided comprising aqueous dispersions of electrically conducting organic polymers and a plurality of nanoparticles. As used herein, the term "dispersion" refers to a continuous medium containing a suspension of minute particles. In accordance with the invention, the "continuous medium" is typically an aqueous liquid, e.g., water. Nanoparticles according to the invention can be inorganic or organic. As used herein, the term "inorganic" means that the nanoparticles are substantially free of carbon. As used herein, the term "organic" means that the nanoparticles are composed substantially of carbon. As used herein, the term "nanoparticle" refers to particles having sizes less than 1000 nanometers (nm).

Compositions according to the invention typically contain a continuous aqueous phase in which the electrically conducting organic polymer is dispersed. Electrically conductive organic polymers contemplated for use in the practice of the invention include, for example, all forms of the polyanilines (e.g., leucoemeraldine, emeraldine, nigraniline, and the like) which are capable of forming acid/base salts to render the polymers electrically conductive. It is well known that different forms of polyaniline polymers can be synthesized, depending upon the degree of oxidation. Polyaniline (PAni) can generally be described as being composed of monomer units having aromatic amine nitrogen atoms, as in Formula I below, and/or aromatic imine nitrogen atoms, as in Formula II below:

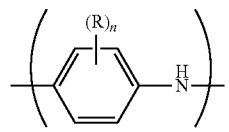

wherein:
n is an integer from 0 to 4;
and
R is independently selected so as to be the same or different at each occurrence and is selected from alkyl, alkenyl, alkoxy, cycloalkyl, cycloalkenyl, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more of sulfonic acid, carboxylic acid, halo, nitro, cyano or epoxy moieties; or any two R groups together may form an alkylene or alkenylene chain completing a 3, 4, 5, 6, or 7-membered aromatic or alicyclic ring, which ring may optionally include one or more divalent nitrogen, sulfur or oxygen atoms.

Although formulae I and II show the monomer units in the unprotonated form, it is known that in the presence of an acid (such as, poly(2-acrylamido-2-methyl-1-propanesulfonic acid (PAAMPSA), poly(styrenesulfonic acid) (PSS), and the like), the basic nitrogen atoms will be protonated to form a salt. The relative proportion of imine nitrogen atoms to amine nitrogen atoms increases with increasing oxidation. In one embodiment, the polyaniline is the emeraldine base form in which the ratio of monomer units having Formula I to those having Formula II is 2:1. In this embodiment, the ratio of amine nitrogen atoms to imine nitrogen atoms is 1:1.

In another embodiment, the electrically conductive organic polymer is poly(dioxythiophene). Poly(dioxythiophenes) contemplated for use in the practice of the invention have Formula III:

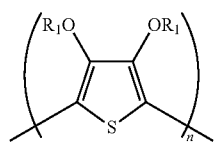

wherein:
$R_1$ and $R_1'$ are each independently selected from hydrogen and alkyl having 1 to 4 carbon atoms,
or $R_1$ and $R_1'$ taken together form an alkylene chain having 1 to 4 carbon atoms, which may optionally be substituted by alkyl or aromatic groups having 1 to 12 carbon atoms, or a 1,2-cyclohexylene radical, and
n is greater than about 9.

The electrically conductive organic polymers used in the invention compositions and methods are typically prepared by oxidatively polymerizing the corresponding monomers in aqueous solution containing a polymeric acid (e.g., PAAMPSA, PSS, and the like). The oxidative polymerization is carried out using an oxidizing agent such as ammonium persulfate, sodium persulfate, or the like. Thus, for example, when aniline is oxidatively polymerized in the presence of PAAMPSA, the electrically conductive acid/base salt PAni/PAAMPSA is formed. When ethylenedioxythiophene (EDT) is oxidatively polymerized in the presence of PSS, the electrically conductive acid/base salt poly(ethylenedioxythiophene) (PEDT)/PSS is formed.

The aqueous solution also can include a polymerization catalyst such as ferric sulfate, ferric chloride, and the like. The polymerization is typically carried out at low temperatures, e.g., between −10° C. and 30° C. After completion of the polymerization reaction, the polymers are optionally isolated by precipitation from aqueous dispersion using a non-solvent for the polymers, e.g., acetone, and the like. When the electrically conductive organic polymer is isolated, the material is typically refined to produce polymer particles having a size less than about 1000 nm. In one embodiment, the polymer particles are less than about 500 nm. In another embodiment, the polymer particles are less than about 50 nm. The isolated electrically conductive organic polymer particles are then either directly combined with an aqueous dispersion of nanoparticles or the conductive organic polymer particles are redispersed in water prior to combination with an aqueous dispersion of nanoparticles.

In another embodiment of the invention methods, the oxidative polymerization is carried out in the presence of nanoparticles, thereby producing an aqueous dispersion without isolating the electrically conductive organic polymer. For example, nanoparticles may be added to an aqueous solution containing aniline monomers, thereby forming a dispersion. An oxidizing agent can then be added to polymerize the monomers in the presence of the nanoparticles. This embodiment of the invention is economically attractive since it provides invention aqueous dispersions in a "one-pot" synthesis. Invention aqueous dispersions prepared by either method provide the advantage of being easily filtered, for example, through a Millex 0.45 μm HV filter. Thus, invention aqueous dispersions readily provide continuous, smooth films.

Organic additives, such as steric stabilizers, may optionally be added to the aqueous solution prior to oxidative polymerization. These additives facilitate formation of electrically conductive organic polymers having nanometer sized particles. Organic additives include, for example, polyacrylamide, polyvinylalcohol, poly(2-vinylpyridine), poly(vinyl acetate), poly(vinyl methyl ether), poly(vinylpyrrolidone), poly(vinyl butyral), and the like.

Nanoparticles contemplated for use in the practice of the present invention can be either inorganic or organic. Inorganic nanoparticles contemplated for use in the practice of the invention include alumina, silica, metallic nanoparticles, electrically semiconductive metal oxides, and the like. In one embodiment, the electrically semiconductive metal oxide is selected from mixed valence metal oxides, such as zinc antimonates, and the like. In another embodiment, the metallic nanoparticles are molybdenum nanoparticles. Organic nanoparticles contemplated for use in the practice of the invention include colloidal sulfonic acids (such as perfluoroethylene sulfonates, and the like), polyacrylates, polyphosphonates, carbon nanotubes, and the like.

Nanoparticles contemplated for use in the practice of the invention may have a variety of shapes and sizes. In one embodiment, the nanoparticles are substantially spherical. In another embodiment, the nanoparticles are substantially elongated such as metal nanowires. Nanoparticles contemplated for use in the practice of the invention typically have an average particle diameter less than about 500 nm. In another embodiment, the nanoparticles have an average particle diameter less than about 100 nm. In still another embodiment, the nanoparticles have an average particle diameter less than about 50 nm. In another embodiment, the aspect ratio of elongated nano-particles is greater than 1 to 100. Aspect ratio is defined as ratio of particle width to particle length. For elongated particles, the "particle size" is considered to be the particle width. In another embodiment, the nano-particles have an irregular geometry. For irregularly-shaped particles, the "particle size" is considered to be size of the smallest screen opening through which the particle will pass. In another embodiment of the invention, there are provided buffer layers cast from aqueous dispersions comprising electrically conductive organic polymers and nanoparticles. Both the electrically conducting polymers and the nanoparticles can be readily dispersed in water. Thus, continuous, smooth films can be produced by casting from aqueous dispersions containing electrically conducting polymers and nanoparticles. Invention buffer layers have a reduced conductivity relative to buffer layers of identical composition except the inorganic nanoparticles are absent. Electrical resistivity is inversely proportional to electrical conductivity. Thus, as employed herein, the phrases "high resistance" and "low conductivity" are used interchangeably with reference to the buffer layers described herein. As used herein, the phrases "high resistance" and "low conductivity" each refer to a conductivity level less than that of a commercially available buffer layers, i.e., less than about $1.0 \times 10^{-3}$ S/cm. In another embodiment, the resistivitys preferably less than $1.0 \times 10^{-5}$ S/cm. Resistivity and conductivity values are typically reported in units of ohm-centimeter (ohm-cm) and Siemens per centimeter (S/cm), respectively. As used herein, conductivity values are reported (using the unit S/cm) rather than resistivity values.

In another embodiment of the invention, there are provided electronic devices comprising at least one electroluminescent layer (usually a semiconductor conjugated polymer) positioned between two electrical contact layers, wherein at least one of the layers of the device includes a buffer layer of the invention. As shown in FIG. 1, a typical device has an anode layer 110, a buffer layer 120, an electroluminescent layer 130, and a cathode layer 150. Adjacent to the cathode layer 150 is an optional electron-injection/transport layer 140. Between the buffer layer 120 and the cathode layer 150 (or optional electron injection/transport layer 140) is the electroluminescent layer 130.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes than the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include indium-tin-oxide ("ITO"), aluminum-tin-oxide, gold, silver, copper, and nickel. The anode may also comprise an organic material such as polyaniline or polythiophene.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

Usually, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The buffer layer 120 is usually cast onto substrates using a variety of techniques well-known to those skilled in the art. Typical casting techniques include, for example, solution casting, drop casting, curtain casting, spin-coating, screen printing, inkjet printing, and the like. Alternatively, the buffer layer can be patterned using a number of such processes, such as ink jet printing.

The electroluminescent (EL) layer 130 may typically be a conjugated polymer such as poly(paraphenylenevinylene) or polyfluorene. The particular material chosen may depend on the specific application, potentials used during operation, or other factors. The EL layer 130 containing the electroluminescent organic material can be applied from solution by any conventional technique, including spin-coating, casting, and printing. The EL organic materials can be applied directly by vapor deposition processes, depending upon the nature of the materials. In another embodiment, an EL polymer precursor can be applied and then converted to the polymer, typically by application of heat or other source of external energy (e.g., visible light or UV radiation).

Optional layer 140 can function both to facilitate electron injection/transport, and also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, Li$_2$O, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include barium, lithium, cerium, cesium, europium, rubidium, yttrium, magnesium, and samarium.

The cathode layer 150 is usually formed by a chemical or physical vapor deposition process. In general, the cathode layer will be patterned, as discussed above in reference to the anode layer 110. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view).

In other embodiments, additional layer(s) may be present within organic electronic devices. For example, a layer (not shown) between the buffer layer 120 and the EL layer 130 may facilitate positive charge transport, band-gap matching of the layers, function as a protective layer, or the like. Similarly, additional layers (not shown) between the EL layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the buffer layer 120, the EL layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

Depending upon the intended application of the electronic device, the EL layer 130 can be a light-emitting layer that is activated by signal (such as in a light-emitting diode) or a layer of material that responds to radiant energy and generates a signal, with or without an applied potential (such as detectors or voltaic cells). Examples of electronic devices that may respond to radiant energy are selected from photoconductive cells, photoresistors, photoswitches, phototransistors, and phototubes, and photovoltaic cells. After reading this specification, skilled artisans will be capable of selecting material(s) that are suitable for their particular applications. The light-emitting materials may be dispersed in a matrix of another material, with or without additives, but preferably form a layer alone. The EL layer 130 generally has a thickness in the range of approximately 50-500 nm.

In organic light emitting diodes (OLEDs), electrons and holes, injected from the cathode 150 and anode 110 layers, respectively, into the EL layer 130, form negative and positively charged polarons in the polymer. These polarons migrate under the influence of the applied electric field, forming a polaron exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

The invention also provides thin film field effect transistor electrodes. In thin film field effect transistors, a dielectric polymer or dielectric oxide thin film is provided with a gate electrode on one side and drain and source electrodes on the other side. Between the drain and source electrode, an organic semiconducting film is deposited. The organic semiconducting polymer film is typically cast from an organic solution using aromatic solvent such as toluene, or chlorinated organic solvent such as chloroform. To be useful for the electrode application, the conducting polymers and the liquids for dispersing or dissolving the conducting polymers must be compatible with the semiconducting polymers and the solvents for the semiconducting polymers to avoid re-dissolution of either conducting polymers or semiconducting polymers. Thin film field effect transistor electrodes fabricated from conducting polymers should have a conductivity greater than 10 S/cm. However, electrically conducting polymers made with a polymeric acid only provide conductivity in the range of ~$10^{-3}$ S/cm or lower. In order to enhance conductivity of the electrically conducting polymers without compromising processability (such as casting, spin-coating, and the like) a highly conductive additive is needed. Accordingly, in another embodiment of the invention, there are provided thin film field effect transistor electrodes. Invention electrodes are cast from aqueous dispersions containing electrically conducting polymers and nanoparticles. In this embodiment, the nanoparticles are typically carbon nanotubes, metal nanoparticles, or metal nanowires resulting in electrodes having a conductivity of greater than about 10 S/cm. In a further embodiment, the electrically conducting polymers are polyanilines/polymeric acid, polydioxyalkylenethiophenes/polymeric acid, or the like.

Figure 2:
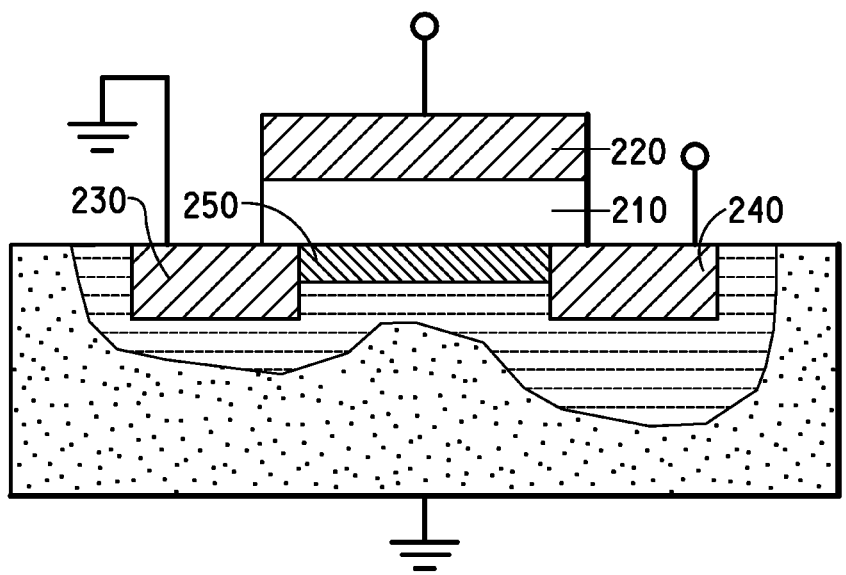
FIG. 2 illustrates a cross-sectional view of a thin film field effect transistor that includes an electrode according to the invention.

The invention also provides thin film field effect transistors containing invention electrodes. Thin film field effect transistors, as shown in FIG. 2, are typically fabricated in the following manner. A dielectric polymer or dielectric oxide thin film 210 has a gate electrode 220 on one side and drain and source electrodes, 230 and 240, respectively, on the other side. Between the drain and source electrode, an organic semiconducting film 250 is deposited. Invention aqueous dispersions containing nanowires or carbon nanotubes are ideal for the applications of gate, drain and source electrodes because of their compatibility with organic based dielectric polymers and semiconducting polymers in solution thin film deposition.

In accordance with another embodiment of the invention, there are provided methods for reducing conductivity of an electrically conductive organic polymer film cast from aqueous dispersion onto a substrate to a value less than about $1 \times 10^{-5}$ S/cm. Such a method can be performed, for example, by adding a plurality of nanoparticles to the aqueous dispersion of electrically conducting polymers. Surprisingly, it has been discovered that even electrically semi-conductive inorganic nanoparticles, when incorporated into an electrically conductive organic polymer film as described herein, reduce the conductivity of the polymer film. In one embodiment, the electrically conductive organic polymer film can be used as a buffer layer in electroluminescent devices. In another embodiment, the electrically conductive polymer film is PAni/PAAMPSA.

In a still further embodiment of the invention, there are provided methods for producing buffer layers having increased thickness. Such a method can be performed, for example, by adding a plurality of nanoparticles to an aqueous dispersion of an electrically conductive organic polymer, and casting a buffer layer from said aqueous dispersion onto a substrate. Addition of nanoparticles to aqueous dispersions of conductive polymers produces aqueous dispersions having an increased viscosity. This enhanced viscosity provides increased control of the thickness of layers cast from the aqueous solutions. Control of buffer layer thickness is desirable since the appropriate thickness of a properly functioning buffer layer depends to some extent on the surface roughness of the metallic conductive layer onto which the buffer layer is deposited.

The invention will now be described in greater detail by reference to the following non-limiting examples.

EXAMPLES

Comparative Example 1

This comparative example illustrates preparation of PAni/PAAMPSA and its electrical conductivity and light emitting device properties as a buffer layer.

Synthesis of PAni/PAAMPSA was carried out in the following manner. Aniline (4.08 g) was dissolved in a 150 ml aqueous solution containing PAAMPSA (6.35 g, PAAMPSA was obtained from Sigma-Aldrich Corp., St. Louis, Mo., USA) in the form of 15 weight % aqueous solution; weight average molecular weight of the PAAMPSA is 2,000,000). The aqueous solution containing aniline and PAAMPSA was placed into a 4-necked 500 ml round bottomed flask and cooled to ~4° C. with an ice/water bath. The solution was stirred continuously with a magnetic stirrer. To the chilled aqueous aniline/PAAMPSA solution, a 100 ml aqueous solution containing 4.235 g PAAMPSA and 2.36 g ammonium persulfate was added at a constant rate over a one hour period. The polymerization was allowed to proceed for 198 minutes.

The reaction mixture was then poured into two centrifuge bottles and centrifuged at 8000 rpm at 15° C. for 30 minutes. After centrifugation, the supernatant was slowly added to acetone to precipitate the polymeric product. After precipitation, the solid polymer was washed repeatedly in acetone, filtered, and dried overnight in a vacuum oven (~18 Hg., $N_2$ bleed, ambient temperature) Yield is 7.03 g.

PAni/PAAMPSA (1.21 g) as prepared above was dispersed in 39.12 g deionized water, which constitutes 3.0 wt % solid in the aqueous solution. The dispersion was tested for electrical conductivity and light emission properties. Commercially available indium tin oxide (ITO)/glass plates having ITO layers 100 to 150 nm thick were cut into samples 30 mm×30 mm in size. The ITO layers were subsequently etched with oxygen plasma. The ITO on the glass substrates to be used for electrical conductivity measurements were etched into a series of parallel lines of ITO to be used as electrodes. The ITO on the substrates to be made into LEDs for light emission measurement were etched into a 15 mm×20 mm layer of ITO to serve as the anode. The aqueous dispersion was then spin-coated onto each of the ITO/glass substrates at a spinning speed of 1,200 rpm. The resulting PAni/PAAMPSA layer was about 137 nm thick.

A sample for viscosity measurement was prepared as follows: 0.0989 g of the PAni/PAAMPSA was mixed with 9.9081 g deionized water, which constitutes 0.99 wt % PAni/PAAMPSA in the dispersion. The mixture was magnetically stirred overnight. It should be noted that the coating thickness is lower (137 nm vs. 300 nm) when compared with Invention Example 4 in spite of lower spin coating speed (1,200 rpm vs. 6,000 rpm). The comparison shows that the dispersion has a lower viscosity than the dispersion in Invention Example 4.

The PAni/PAAMPSA coated ITO/glass substrates were dried in nitrogen at 90° C. for 30 minutes before measuring for electrical conductivity. Electrical conductivity was determined by measuring the resistance between two electrodes and was calculated to be $3.6 \times 10^{-5}$ S/cm based on the resistance, the thickness of the conductive layer and the distance between the two electrodes used to measure the resistance. The conductivity is shown in Table I.

For light emission measurements, when incorporated into a light emitting diode (LED), the PAni/PAAMPSA layer was top-coated with a super-yellow emitter poly(substituted-phenylene vinylene) (PDY 131 obtained from Covion Company, Frankfurt, Germany) to serve as the active electroluminescent (EL) layer. The thickness of the EL layer was approximately 70 nm. All film thicknesses were measured with a TENCOR 500 Surface Profiler. For the cathode, Ba and Al layers were vapor deposited onto the EL layer at a pressure of $1.3 \times 10^{-4}$ Pa. The final thickness of the Ba layer was 3 nm; the thickness of the Al layer on top of the Ba layer was 300 nm. LED device performance was tested as follows. Measurements of current vs. applied voltage, light emission brightness vs. applied voltage, and light emission efficiency (candela/ampere-cd/A) were measured with a Keithley 236 source-measure unit from Keithley Instrument Inc. (Cleveland, Ohio), and a S370 Optometer with a calibrated silicon photodiode (UDT Sensor, Inc., Hawthorne, Calif.). Current was applied to each of five LED with a current density of 8.3 mA/cm$^2$ at room temperature. The average voltage to achieve the current density was 4.2 volts and the average light efficiency, and light emission brightness were 8.3 cd/A and 115 cd/m$^2$, respectively, as summarized in Table I. Table I also shows that device half-life at 80° C. and 3.3 mA/cm$^2$ current density was 12 hrs.

Invention Example 1

This example illustrates preparation of an aqueous PAni/PAAMPSA dispersion with silica nanoparticles and its electrical conductivity and light emission properties as a buffer layer.

PAni/PAAMPSA (0.63 g) prepared as in Comparative Example 1 was combined with 0.75 g Snowtex-UP® (0.75 g, Nissan Chemical Industries, Ltd. Tokyo, Japan), which contains 0.152 g silica nanoparticles, and 24.07 g deionized water. Snowtex-UP® is an aqueous dispersion having a pH from 9.0 to 10.5, and having a silica particle size of about 5-20 nm in width and about 40-300 nm in length. The silica:PAni/PAAMPSA weight ratio is 4.1:1.

The dispersion was tested for electrical conductivity and light emission properties in the same manner as described in Comparative Example 1. As shown in the results summarized in Table 1, a buffer layer cast from the dispersion of Invention Example 1 has a lower conductivity ($8.2 \times 10^{-7}$ S/cm vs. $3.6 \times 10^{-5}$ S/cm) and higher half-life (29 hours vs. 12 hours) when compared with Comparative Example 1. This example demonstrates effect of nano-particles on reducing conductivity with enhanced device life-time.

Invention Example 2

This example illustrates preparation of an invention aqueous PAni/PAAMPSA dispersion with colloidal silica and its electrical conductivity and light emission properties as a buffer layer.

PAni/PAAMPSA (0.61 g) as prepared in Comparative Example 1 was combined with Snowtex-O® (0.75 g, from Nissan Chemical Industries, Ltd. Tokyo, Japan), which contains 0.153 g silica nanoparticles, and 23.47 g deionized water. Snowtex-O® is an aqueous dispersion having a pH range of 2-4 and having a silica particle size of 10-20 nm. The silica:PAni/PAAMPSA weight ratio is 3.99:1

The dispersion was tested for electrical conductivity and light emission properties in the same manner as described in Comparative Example 1. As shown in the results summarized in Table 1, a buffer layer cast from the dispersion of Invention Example 2 has a lower conductivity ($7.6 \times 10^{-7}$ S/cm vs. $3.6 \times 10^{-5}$ S/cm) and higher half-life (30 hours vs. 12 hours) when compared with Comparative Example 1. This example again demonstrates effect of nano-particles on reducing conductivity with enhanced device life-time.

Invention Example 3

This example illustrates preparation of an invention aqueous PAni/PAAMPSA dispersion with electrically semi-conductive oxide and its electrical conductivity and light emission properties as a buffer layer.

PAni/PAAMPSA (0.90 g) as prepared in Comparative Example 1 was combined with Celnax CX-Z300H® (1.97 g, a zinc antimonite from Nissan Chemical Industries, Ltd. Tokyo, Japan), which contains 0.601 g conductive oxide particles, and 48.53 g deionized water. The Celnax CX-Z300H® is an aqueous dispersion having a pH of 6.85, and having 20 nm oxide nanoparticles. Conductivity of the oxide powder is 3.6 S/cm measured on a compressed dried pellet at a pressure of 160 Kg/cm². The oxides:PAni/PAAMPSA weight ratio is 1.50:1

The dispersion was tested for electrical conductivity and light emission properties in the same manner as described in Comparative Example 1. As shown in the results summarized in Table 1, a buffer layer cast from the dispersion of Invention Example 3 has a lower conductivity ($8.3 \times 10^{-8}$ S/cm vs. $3.6 \times 10^{-5}$ S/cm) and higher half-life (61 hours vs. 12 hours) when compared with Comparative Example 1. This example again demonstrates effect of nano-particles on reducing conductivity with enhanced device life-time.

Invention Example 4

This example illustrates the preparation of an invention aqueous dispersion of PAni/PAAMPSA in the presence of $SiO_2$ nanoparticles and its electrical conductivity and light emitting properties as a buffer layer.

Synthesis of PAni/PAAMPSA in the presence of $SiO_2$ nanoparticles was carried out in the following manner. PAAMPSA (36.32 g of 15 wt % aqueous solution from Sigma-Aldrich Corp., St. Louis, Mo., USA) was placed in a 250 Nalgene® plastic bottle. To the PAAMPSA solution was added Snowtex-UP® (34.33 g from Nissan Chemical Industries, Ltd. Tokyo, Japan). Snowtex-UP® is an aqueous dispersion with pH of 9.0 to 10.5, containing silica particles sized 5-20 nm in width and 40-300 nm in length. The PAAMPSA/Snowtex-Up® silica mixture was dispersed in deionized water (150 ml). To this dispersion was added aniline (4.08 g). The aqueous PAAMPSA/Snowtex-Up®/aniline mixture was placed in a 4-necked 500 ml Round Bottomed Flask and then cooled to ~4° C. with an ice/water mixture. The solution was stirred continuously with a magnetic stirrer. To the chilled PAAMPSA/Snowtex-Up®/aniline dispersion 100 ml aqueous solution containing 4.493 g PAAMPSA (as above) and ammonium persulfate (2.33 g) was added over a one hour period. The reaction was allowed to proceed for 180 minutes.

The reaction mixture was then poured into two centrifuge bottles and centrifuged at 8000 rpm at 15° C. for 30 minutes. After centrifugation, the supernatant was slowly added to acetone to precipitate the polymeric product. After precipitation, the solid polymer was washed repeatedly in acetone, filtered, and dried overnight in a vacuum oven (~18 Hg., $N_2$ bleed, ambient temperature) (Yield was 14.19 g). It should be noted that the yield is almost twice the yield in Comparative Example 1. The increase in yield indicates that $SiO_2$ nanoparticles are present within the PAni/PAAMPSA.

PAni/PAAMPSA/$SiO_2$ (1.20 g, as prepared above) was dispersed in 38.80 g deionized water, which dispersion constitutes 3.0 wt % solid in the water. A buffer layer was cast onto an ITO substrate as in the previous examples. For light emission measurements, the PAni/PAAMPSA/silica layer was then top-coated with a super-yellow emitter poly(substituted-phenylene vinylene) (PDY 131 obtained from Covion Company, Frankfurt, Germany) to serve as the active electroluminescent (EL) layer in an LED device. The thickness of the EL layer was approximately 70 nm. Thickness of all films was measured with a TENCOR 500 Surface Profiler. For the cathode, Ba and Al layers were vapor deposited on top of the EL layer under a vacuum of $1.3 \times 10^{-4}$ Pa. The final thickness of the Ba layer was 3 nm; the thickness of the Al layer on top of the Ba layer was 300 nm. LED device performance was tested as follows. Measurements of current vs. applied voltage, light emission brightness vs. applied voltage, and light emission efficiency (candela/ampere-cd/A) were measured with a Keithley 236 source-measure unit from Keithley Instrument Inc. (Cleveland, Ohio), and a S370 Optometer with a calibrated silicon photodiode (UDT Sensor, Inc., Hawthorne, Calif.). Current was applied to each of five LED devices with a current density of 8.3 mA/cm² at room temperature. The average voltage to achieve the current density was 4.3 volts and the average light efficiency, and light emission brightness were 5.3 cd/A and 130 cd/m², respectively, as summarized in Table I. Table I also shows that device half-life at 80° C. and 3.3 mA/cm² current density was 42 hrs. It should be noted that the half-life is enhanced 4× and emission intensity is higher (130 cd/m² vs. 115) when compared with the PAni/PAAMPSA without silica in spite of the thickness being 2.2 times the thickness illustrated in Comparative Example 1.

TABLE 1

Effect of inorganic nanoparticles added to PAni/PAAMPSA on
light emission properties of OLEDs on a glass substrate

| Example | Coating thickness (nm) | Conductivity (S/cm) | Voltage (volt) @ 8.3 mA/cm$^2$ | Efficiency (Cd/A) @ 8.3 mA/cm$^2$ | Brightness (Cd/m$^2$) @ 3.3 mA/cm$^2$, 80° C. | Half-life (hr) @ 3.3 mA/cm$^2$, 80° C. |
|---|---|---|---|---|---|---|
| Comparative Example 1 | 137 @ 1,200 rpm | $3.6 \times 10^{-5}$ | 4.2 | 8.3 | 115 | 12 |
| Invention Example 1 | 114 @ 1,200 rpm | $8.2 \times 10^{-7}$ | 4.8 | 8.1 | 135 | 29 |
| Invention Example 2 | 166 @ 1,200 rpm | $7.6 \times 10^{-7}$ | 4.9 | 7.4 | 108 | 30 |
| Invention Example 3 | 113 @ 1,200 rpm | $8.3 \times 10^{-8}$ | 4.1 | 8.0 | 148 | 61 |
| Invention Example 4 | 300 @ 6,000 rpm | $9.0 \times 10^{-7}$ | 4.3 | 5.3 | 130 | 42 |

As shown in Table 2, the aqueous dispersion of Invention Example 4 produces a 300 nm coating thickness at a spinning speed of 6,000 rpm. The coating thickness is much higher than that of Comparative Example 1 (300 nm vs. 137 nm) despite a higher spin-coating speed (6,000 rpm vs. 1,200 rpm). The comparison shows that the PAni/PAAMPSA polymerized with silica nanoparticles has a higher viscosity than PAni/PAAMPSA polymerized without silica nanoparticles. As shown in Table II, this increased viscosity produces buffer layers having an increased thickness. The dispersion for viscosity measurement was prepared as follows: 0.0999 g of the PAni/PAAMPSA/silica was mixed with 9.9164 g deionized water, which constitutes 1.00 wt % PAni/PAAMPSA/silica in the dispersion.

TABLE 2

Viscosity of Aqueous PAni/PAAMPSA Dispersions

| Sample | Viscosity (cps) | | |
|---|---|---|---|
| | 10 s$^{-1}$ | 100 s$^{-1}$ | 1000 s$^{-1}$ |
| Comparative Example 1 | 5.50 | 4.52 | 4.10 |
| Invention Example 4 | 8.30 | 6.80 | 6.15 |

Invention Example 5

This example demonstrates the integrity of solid films, prepared from a commercial aqueous PEDT dispersion, in organic solvents In this example, a commercially available aqueous PEDT dispersion (Baytron-P VP AI 4083 from H. C. Starck, GmbH, Leverkusen, Germany), which has conductivity of ~10$^{-3}$ S/cm, was dried to solid films in a glass beaker under a nitrogen flow at room temperature. The dried films were mixed with common organic solvents (such as toluene, chloroform, dichloromethane, or the like) used to dissolve organic semiconducting polymers in the manufacture of thin film field effect transistors. The film flakes were not swollen by either of the organic liquids nor discolored the liquid. This result clearly demonstrates that PEDT films made from the Baytron-P are compatible with the organic solvents for semiconducting polymers, thereby demonstrating utility as electrodes for thin film field effect transistors.

Invention Example 6

This example demonstrates the integrity of solid films, prepared from an aqueous dispersion of PAni/PAAMPSA in organic solvents.

In this example, the aqueous dispersion of PAniPAAMPSA prepared in Comparative Example 1 was dried to solid films in a glass beaker under a nitrogen flow at room temperature. The dried films were mixed with common organic solvents (such as toluene, chloroform, dichloromethane, or the like) used to dissolve organic semiconducting polymers in the manufacture of thin film field effect transistors. The film flakes were not swollen by either of the organic liquids nor discolored the liquid. This result clearly demonstrated that the PAni/PAAMPSA films made from aqueous dispersions of PAni/PAAMPSA are compatible with the organic solvents for semiconducting polymers, thereby demonstrating utility as electrodes for thin film field effect transistors.

Invention Example 7

This example illustrates the preparation of an invention aqueous dispersion containing a polyaniline/polymeric acid or a poly(dioxyethylenethiophene)/polymeric acid and highly conductive nanoparticles.

As shown in Comparative Example 1, electrical conductivity of PAni/PAAMPSA cast from an aqueous dispersion of PAni/PAAMPSA is only $3.6 \times 10^{-5}$ S/cm, which is not sufficient for the application as gate, drain or source electrodes of thin film field effect transistors. The highest conductivity ever achieved from aqueous dispersion of PAni, for example from Ormecon (Ammersbeck, Germany) or PEDT, for example Baytron-P, is about 10$^{-3}$ S/cm, which is still too low for the application. However, use of invention aqueous conducting polymer dispersions containing nanoparticles such as nanowire or nano-particles of metal or carbon nanotubes dramatically increases the conductivity of electrodes cast from these aqueous dispersions. For example, metallic molybdenum wires having diameter of 15 nm and conductivity of $1.7 \times 10^4$ S/cm can be used for enhanced conductivity. Carbon nanotubes having dimension of 8 nm diameter and 20 μm length and conductivity of 60 S/cm can also be used to enhance conductivity. Because of the high conductivity of the nanoparticles and dispersibility of the particles in water, composite aqueous dispersions consisting of the electrically conducting polymers and the highly conductive nanoparticles can be readily prepared for fabricating continuous, smooth films as drain, source or gate electrodes in thin film field effect transistors.

While the invention has been described in detail with reference to certain preferred embodiments thereof, it will be understood that modifications and variations are within the spirit and scope of that which is described and claimed.

What is claimed is:

1. A composition comprising an aqueous dispersion of an electrically conductive organic polymer and a plurality of nanoparticles wherein said electrically conductive organic polymer is selected from polyaniline with poly(2-acrylamido-2-methyl-1-propanesulfonic acid) as the counterion (Pani/PAAMPSA) and poly(ethylenedioxythiophene) with poly(styrenesulfonic acid) as the counterion (PEDT/PSS) and wherein nanoparticles are selected from the group consisting of inorganic nanoparticles, and wherein the composition is capable of forming a buffer layer having a conductivity of less than $1 \times 10^{-5}$ S/cm.

2. A composition according to claim 1, wherein said inorganic nanoparticles are selected from silica, alumina and electrically conductive metal oxides.

3. A composition according to claim 1, wherein said nanoparticles have a particle size less than about 500 nm.

4. A composition according to claim 1, wherein said nanoparticles have a particle size less than about 250 nm.

5. A composition according to claim 1, wherein said nanoparticles have a particle size less than about 50 nm.

6. A composition according to claim 2, wherein the weight ratio of silica:electrically conductive polymer is about 4:1.

* * * * *